(12) United States Patent
Minneman et al.

(10) Patent No.: US 9,008,142 B2
(45) Date of Patent: Apr. 14, 2015

(54) SYSTEM AND METHOD FOR OPTIMIZATION OF COHERENCE LENGTH OF TUNABLE LASER SOURCES

(75) Inventors: Michael Minneman, Lafayette, CO (US); Jason Ensher, Lafayette, CO (US); Thomas Milner, Lafayette, CO (US)

(73) Assignee: Insight Photonic Solutions, Inc., Lafayette, CO (US)

( * ) Notice: Subject to any disclaimer, the term of this patent is extended or adjusted under 35 U.S.C. 154(b) by 269 days.

(21) Appl. No.: 13/555,107

(22) Filed: Jul. 21, 2012

(65) Prior Publication Data
US 2013/0044771 A1 Feb. 21, 2013

Related U.S. Application Data

(60) Provisional application No. 61/510,782, filed on Jul. 22, 2011.

(51) Int. Cl.
| | |
|---|---|
| *H01S 5/00* | (2006.01) |
| *H01S 5/065* | (2006.01) |
| H01S 5/0625 | (2006.01) |
| H01S 5/14 | (2006.01) |
| H01S 5/183 | (2006.01) |

(52) U.S. Cl.
CPC ............ *H01S 5/0652* (2013.01); *H01S 5/06256* (2013.01); *H01S 5/141* (2013.01); *H01S 5/183* (2013.01)

(58) Field of Classification Search
CPC ... H01S 5/0652; H01S 5/06256; H01S 5/183; H01S 5/141
USPC ................................. 372/6, 20, 50.1
See application file for complete search history.

(56) References Cited

U.S. PATENT DOCUMENTS

| | | | |
|---|---|---|---|
| 8,351,473 B1 * | 1/2013 | Darcie et al. .................... 372/20 |
| 2003/0147442 A1 * | 8/2003 | Larson et al. ................... 372/50 |
| 2007/0133650 A1 * | 6/2007 | Kim et al. ...................... 372/102 |
| 2009/0067459 A1 * | 3/2009 | Mizuuchi et al. ............... 372/25 |

* cited by examiner

*Primary Examiner* — Yuanda Zhang
(74) *Attorney, Agent, or Firm* — Renner, Otto, Boisselle & Sklar, LLP.

(57) ABSTRACT

A system and method for adjusting the coherence length of a tunable laser to optimize measurements and reduce artifacts. A tuning element of the laser system modulates, adjusts, or controls parameters associate with the tunable laser, such that the output wavelength of the tunable laser is modulated or adjusted over a wavelength range within a time interval. Modulation of the parameter has the effect of increasing a linewidth of the tunable laser.

20 Claims, 2 Drawing Sheets

SYSTEM AND METHOD FOR OPTIMIZATION OF COHERENCE LENGTH OF TUNABLE LASER SOURCES

RELATED APPLICATION DATA

This application claims the benefit of U.S. Provisional Application No. 61/510,782, filed Jul. 22, 2011, which is hereby incorporated in by reference.

TECHNICAL FIELD

The present invention relates generally to an apparatus and a method to reduce coherence length in swept-wavelength lasers for improving measurements in optical imaging, such as coherence tomography (OCT), optical frequency domain reflectometry (OFDR), spectroscopy, remote sensing and telecommunication testing systems.

BACKGROUND

Applications that utilize swept-wavelength lasers rely on precise measurements and control of the laser. A variety of artifacts may hinder the measurement process. For example, etalons formed from small air gaps in the optical path can lead to intensity modulation from interferences, especially when the laser is tuned over a range of wavelengths. The resulting intensity modulation creates an uncertainty in the measurement of insertion loss or polarization dependent loss. Likewise, stray reflections from other elements in the optical system, for example lenses or beam-splitters, can introduce additional reflections that interfere with the reference signal. The additional interference signals add noise to the signal from the sample. In interferometric imaging such as Optical Coherence Tomography, secondary reflections from tissue create image ghosting when the coherence length is sufficiently in excess of the primary imaging depth.

In the field of telecommunications, lasers for testing and measuring may offer a version of coherence control. Lasers for telecommunications testing are often external cavity diode lasers, based on a semiconductor gain section. Coherence control in External Cavity Tunable Laser Sources (EC-TLS) often consists of modulating the gain current, which causes temperature variations in the gain medium. Temperature variation in the gain medium modulates the cavity length, which in turn changes the laser wavelength. The modulation bandwidth is limited by the thermal time constants of the heat propagating through the semiconductor. Further, modulating the current through the gain medium also modulates the output power of the laser, which may introduce noise to the measurement application.

Based on the foregoing, an alternative method of coherence control is desirable.

SUMMARY

Aspects of the present invention relate to a system and method for adjusting the coherence length of a laser to optimize measurements. For example, measuring the power through a fiber-optic component for telecommunications may be improved if the effect of various, unintended etalons may be eliminated. Etalons formed from small air gaps in the optical path can lead to intensity modulation from interferences, especially when the laser is tuned over a range of wavelengths. The resulting intensity modulation creates an uncertainty in the measurement of insertion loss or polarization dependent loss. By reducing the coherence length of the laser, intensity modulations due to interferences may be eliminated or reduced, thereby improving the accuracy of measurements in telecommunications testing.

The system and method may also improve measurements made in OCT or OFDR systems. OCT and OFDR measurements are performed with an interferometer that interferes light from a reference signal and light from a sample under test. Stray reflections from other elements in the optical system, for example lenses or beam-splitters, can introduce additional reflections that interfere with the reference signal. The additional interference signals add noise to the signal from the sample. By reducing the coherence length, interference from stray reflective elements in the optical system may be suppressed, thereby reducing noise on the OCT or OFDR signal from the sample.

No existing tunable laser for OCT provides a direct system or method for reducing coherence length that does not require additional components or modulation of the laser gain section. Previously employed methods to reduce coherence length were secondary effects of modulating the gain. Modulating the gain in this manner created wavelength instability that manifested itself as broader linewidth and thus reduced coherence length.

A number of features are described herein with respect to embodiments of the invention. It will be appreciated that features described with respect to a given embodiment also may be employed in connection with other embodiments.

The invention comprises the features described herein, including the description, the annexed drawings, and, if appended, the claims, which set forth in detail certain illustrative embodiments. These embodiments are indicative, however, of but a few of the various ways in which the principles of the invention may be employed.

DESCRIPTION

Figure 1A:
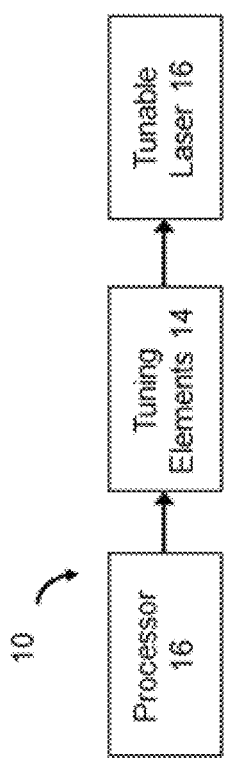
FIG. 1A is an exemplary system in accordance with aspects of the present invention.

Aspects of the present invention relate to a system and a method for adjusting the coherence length of a laser to optimize measurements. Coherence length of a laser system is modulated by changing, e.g., the wavelength and/or the linewidth of the laser. An exemplary system 10 is illustrated in FIG. 1A. The system 10 includes a tunable laser 12 with one or more tuning elements 14 operably coupled to the tunable laser 12 for changing a parameter associated with the tunable laser 12. Such parameters include feedback mirror spacing, cavity length, (phase) or any combination thereof. A processor 16 may provide the control input for changing the one or more parameters.

In an exemplary system, the tunable laser 12 is a monolithic semiconductor structure with tuning elements 14 including a gain section, mirror section, and phase section, such as a Vernier-tuned Distributed Bragg Reflector (VTDBR). In another exemplary configuration, the tunable laser 12 may comprise a Vertical Cavity Surface Emitting Lasers (VCSELs) with a tuning element 14 comprising a tunable mirror external to the semiconductor laser.

In one embodiment, parameters are modulated, adjusted, or controlled by the tuning element 14 for at least one of the gain, mirror or phase section, such that the output wavelength of the laser is modulated, adjusted, or controlled over a wavelength range within a time interval. In another embodiment, the parameters are modulated, adjusted, or controlled by a tuning element 14 comprising a tuning element 14 comprising an external tuning mirror, such as a Micro-electromechanical systems (MEMS) mirror coupled to the tunable laser 12. Modulation of parameters mirror position or angle controls the output wavelength of the tunable laser 12 within a time interval. Modulating the output wavelength of the tunable laser 12 changes the coherence length of the tunable laser 12.

In an exemplary system 20, the laser 12 is a monolithic semiconductor structure. The tuning elements 14 include a gain section, mirror section, and phase section, such as an VTDBR. In another exemplary configuration, the tunable laser 12 may comprise a VCSEL with tuning element 14 including a tunable mirror 18 external to the semiconductor forming one of the cavity mirrors of the laser. The distance of the mirror from the semiconductor is a parameter that can be varied by the tuning elements 14, thereby tuning the wavelength—and thus the coherence length—of the laser.

The output wavelength of VTDBR lasers may be tuned by adjusting the parameters corresponding to the phase, front mirror and back mirror currents. Through an appropriate combination of current vs. time waveforms, the output wavelength of an VTDBR laser may be tuned continuously over a range of 50 nm, resulting in a change in the coherence length. The linewidth of a VTDBR laser may be, e.g., 1-10 MHz when the control currents are not varied.

Alternatively, the wavelength of the VTDBR laser may be modulated over a short periods of time by modulating the parameters corresponding to the control currents over the period of time. For example, the phase current parameter may be modulated, thereby adjusting the cavity length parameter of the tunable laser 12 and modulating the output wavelength and coherence length of the VTDBR. The modulation amplitude of the control current parameter by the tuning element 14 determines the modulation of the laser wavelength and correspondingly the coherence length. The modulation may be added to the current vs. time waveforms of the phase section, front or back mirror sections, such that the modulation period is much smaller than the duration of the current vs. time waveform and the modulation amplitude is much smaller than the range of the current vs. time waveform.

In a telecommunications test application, the wavelength modulation—resulting in coherence length modulation—of the laser may have the effect of broadening the linewidth of the laser. One exemplary application is to measure the transmission of light through a fiber-optic component versus wavelength. Spurious etalons, caused by poor fiber-optic connections or air-gaps in components, may cause amplitude modulations in the transmission of light through a component. The etalon modulation will appear as noise in the transmission measurement, especially as the wavelength is varied. One method of improving the measurement of the transmission is to modulate parameters with the tuning element 14 such that the output wavelength of the source changes by an amount larger than the free spectral range of the spurious etalon, over an interval of time shorter than the measurement time at each sample of the wavelength sweep. The wavelength modulation will average over the etalon modulation over the measurement interval, which reduces the modulation effect on the measurement of transmission through a component under test.

For an OCT application, the ideal sweep of the laser's optical frequency vs. time is in equal steps of optical frequency per unit time (i.e. the optical frequency sweep is linear in time). In the art, such a profile is called k-linear. OCT measurements typically consist of interference fringes from an interferometer. The fringes are sampled ideally in equal steps of optical frequency, to enable precise determination of the power spectral density of the fringes. The power spectral density of OCT fringes is called the Point Spread Function (PSF). When the fringes are sampled in equal steps of optical frequency, the PSF will have the maximum signal-to-noise ratio and the narrowest resolution over the scan depth of the laser sweep. The tuning element 14 may step parameters related to the currents of an VTDBR laser to produce a k-linear sweep of the optical frequency that is linear in time.

In the present invention, the current steps of the VTDBR laser may be modified from the temporal waveform that produces a k-linear sweep. Instead, the currents of the VTDBR laser may be adjusted by the tuning element 14 to modulate the optical frequency slightly above or below the equal optical frequency interval per unit time. The result in the Fourier Transform of data sampled at those steps is a lower signal-to-noise ratio and broader peak of the PSF. These effects are indistinguishable from the effect of performing OCT measurements with a laser of lower coherence length (and broader linewidth). The amplitude of the current modulation by the tuning element 14, above or below the optimal current profile vs. time, determines how much the PSF is degraded—thereby controlling the effective coherence length. Furthermore, the period of modulation of the current above or below the optimal current profile determines the measurement bandwidth—and hence the scan depths—at which the effective coherence length degrades the PSF.

As an example, consider a current versus time waveform lasting 5 microseconds (μsec). The waveform may be generated from a series of 2000 current steps generated by a waveform generator with 2.5 nanoseconds between steps. The total wavelength range of the sweep may be 100 nanometers. The current modulation above or below the k-linear profile may produce a variation of the optical frequency +/−0.5 GHz, producing an effective linewidth of 1 GHz over the period of the modulation. If the modulation period is 3 current steps, or 5 nanoseconds, then the coherence length of the laser will be reduced up to the full measurement bandwidth of 400 MHz, or the full scan depth of the OCT measurement. The k-space sampling interval provides the scan depth of the measurement by c/2/dv, where c is the speed of light and dv is the frequency interval of the k-clock. For an interval of 6.25 GHz, the scan depth is 24 mm. Hence, a 1 GHz frequency modulation out of a step of 6.25 GHz creates a phase error of 1 radian at 24 mm scan depth. This phase error suppresses interference information at or beyond 24 mm. Increasing the amplitude of the optical frequency modulation from +/−0.5 GHz to a greater value would further suppress interference information at this scan depth.

The values in the above example are exemplary and by no means exclude the use of other values of modulation or optical frequency interval, as would be clear to someone skilled in the art.

In another embodiment of the invention, the wavelength tuning of a VCSEL laser may be modulated by tuning element 14 to suppress the coherence length of the VCSEL. The VCSEL laser system may consist of tuning element 14 comprising an analog or digitized signal waveform that adjusts the position or angle of an external cavity mirror, which tunes the laser's wavelength. In one embodiment, the wavelength of a VCSEL laser is swept by an analog drive signal, such as a sine wave, to the external cavity mirror. A small analog modulation signal may be added to the nominal analog drive signal parameter by the tuning element 14, with a period and amplitude that sets the timescale and amount of linewidth broadening—and hence, coherence length reduction. In an alternate system embodiment, the output wavelength of the VCSEL may be driven by a digitized waveform that adjusts parameters associate with the external cavity mirror. The digitized waveform may be constructed by the tuning element 14 to provide a k-linear sweep, or any sweep profile of the laser wavelength vs. time from a first wavelength to a second wavelength. In an exemplary embodiment, the digitized sweep of the VCSEL laser's external cavity mirror produces a k-linear sweep. The waveform values at each step may be modulated above and below the equal optical frequency step interval by the tuning element 14, as described in the above, to broaden the effective linewidth for an OCT measurement over a desired scan depth, or for averaging-out the effect of spurious etalons over a desired measurement time interval in a telecommunications test application.

Figure 1B:
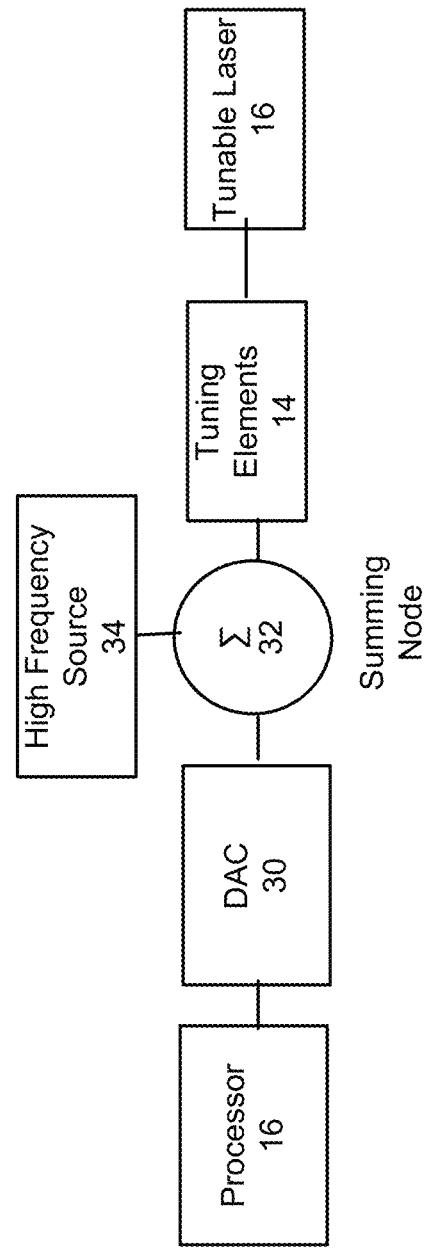
FIG. 1B is another exemplary system in accordance with aspects of the present invention.

Another embodiment of the present invention is illustrated in FIG. 1B. In FIG. 1B, a processor 16 is coupled to a digital to analog converter (DAC) 30 to convert signals output from the processor to analog signal. A high frequency source 34 is combined with the analog signal output from DAC 30 and coupled to a summing node 32. The combined signal is then coupled to the tuning elements 14 and tunable laser 16, as discussed above.

Figure 2:
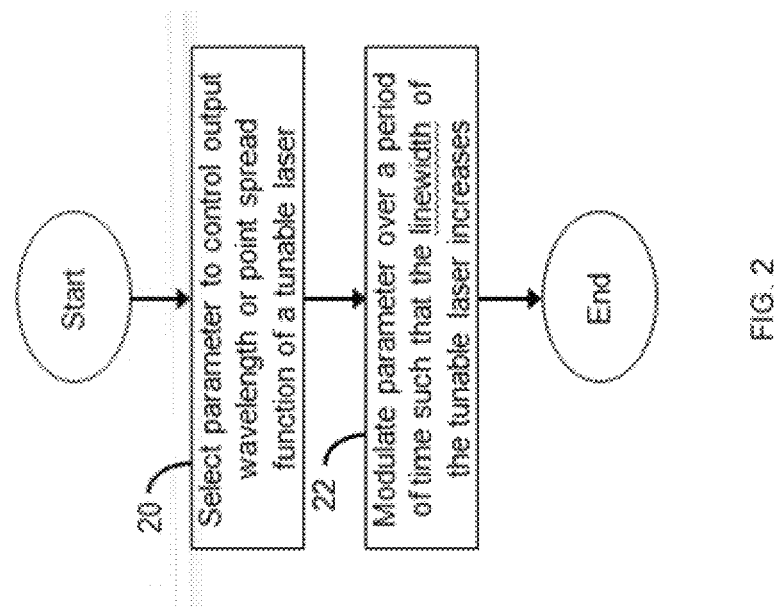
FIG. 2 illustrates a flow diagram depicting exemplary steps in a method in accordance with aspects of the present invention.

FIG. 2 illustrates exemplary steps of a method to reduce coherence length in swept-wavelength lasers for improving measurements. In the method, a parameter is selected to control the output wavelength or point spread function of a tunable laser 20. Next, the parameter is modulated over a period of time such that the linewidth of the tunable laser increases 22.

It is not uncommon in conventional laser systems to utilize modulation of the laser gain medium to generate a temperature change within the laser, which in turn tends to broaden the linewidth and reduce the coherence. The above described system and method is inherently different than conventional systems and methods, in that aspects of the present invention relate to directly modulating the effective cavity length, thus directly changing the linewidth and coherence length.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A laser system for decreasing a coherence length of a tunable laser, the laser system comprising:
the tunable laser;
one or more tuning elements adapted to modulate at least one parameter associated with the tunable laser over a period of time;
the parameter controlling an output wavelength of the tunable laser, wherein the parameter is modulated such that a linewidth of the tunable laser increases and a point spread function measured through a fiber optic component changes; and
the fiber optic component adapted to receive electromagnetic radiation output by the tunable laser, the fiber optic component comprising at least one spurious etalon;
wherein the parameter is modulated such that the output wavelength of the tunable laser changes by an amount larger than a free spectral range of the spurious etalon over an interval of time shorter than a measure time of the laser system.

2. The laser system of claim 1, further comprising a processor adapted to provide a control input to the tuning elements directing the tuning elements to change one or more parameters.

3. The laser system of claim 1, wherein modulation of the parameter changes at least one of wavelength, cavity length, and phase.

4. The laser system of claim 1, wherein the tuning elements comprise at least one of a gain section, mirror section, and phase section.

5. The laser system of claim 1, wherein the tunable laser comprises a vertical cavity surface emitting laser (VCSEL), the tuning elements comprise a tunable mirror exterior to the semiconductor laser, and the parameter comprises a mirror distance from a semiconductor.

6. The laser system of claim 5, wherein the tuning elements generate an analog drive signal waveform and an analog modulation signal added to the analog drive signal, and the parameters comprise at least one of an external mirror position and an external mirror angle.

7. The laser system of claim 5, wherein the parameters comprise at least one of external mirror position and external mirror angle, the tuning elements generate a digitized drive signal waveform and the tuning elements modulating the waveform value at each step above or below an equal optical frequency step interval.

8. The laser system of claim 1, wherein the tuning elements comprise an external tuning mirror and the parameters comprise at least one of mirror position and mirror angle.

9. The laser system of claim 8, wherein the external tuning mirror comprises a micro-electromechanical systems (MEMS) mirror.

10. A laser system for decreasing a coherence length of a tunable laser, the laser system comprising:
the tunable laser, wherein the tunable laser comprises a Vernier-Tuned Distributed Bragg Reflector (VTDBR);
one or more tuning elements adapted to modulate at least one parameter associated with the tunable laser over a period of time, wherein:
the tuning elements comprise at least one of a gain section, mirror section, and phase section; and
the at least one parameter includes current supplied to the VTDBR and controls an output wavelength of the tunable laser;
a processor configured to provide control input to the one or more tuning elements for modulating the current supplied to the VTDBR in order to change an optical frequency of the VTDBR above and/or below an equal optical frequency interval per unit time such that a linewidth of the tunable laser increases and a point spread function measured through an optical system changes.

11. The laser system of claim 10, wherein the parameters comprise at least one of a phase current, a front mirror current, and a back mirror current.

12. The laser system of claim 10, wherein the tunable laser is a Super Structure Distributed Bragg Reflector laser.

13. The laser system of claim 10, wherein the tunable laser is a Sampled-Grating Distributed Bragg Reflector laser.

14. A method of decreasing a coherence length of a tunable laser outputting electromagnetic to a fiber optic component including at least one spurious etalon, the method comprising:
modulating a parameter associated with the tunable laser over a period of time;

selecting the parameter to control an output wavelength of the tunable laser; and modulating the parameter such that a linewidth of the tunable laser increases, a point spread function measured through the fiber optic component changes, and the output wavelength of the tunable laser changes by an amount larger than a free spectral range of the spurious etalon over an interval of time shorter than a measure time of the laser system.

15. The method of claim 14, wherein modulation of the parameter changes at least one of wavelength, cavity length, and phase.

16. The method of claim 14, wherein the parameters comprise at least one of a phase current, a front mirror current, and a back mirror current.

17. The method of claim 14, wherein the parameter comprises a mirror distance from a semiconductor.

18. The method of claim 14, wherein the parameters comprise at least one of an external mirror position and an external mirror angle.

19. A method of decreasing a coherence length of a tunable laser comprising a Vernier-Tuned Distributed Bragg Reflector (VTDBR) having tuning elements comprising at least one of a gain section, mirror section, and phase section, the tunable laser outputting electromagnetic to a fiber optic component, the method comprising:

modulating at least one parameter associated with the tunable laser over a period of time, wherein:
the at least one parameter is modulated by controlling input to the one or more tuning elements;
the at least one parameter includes current supplied to the VTDBR and controls an output wavelength of the tunable laser;
modulating the at least one parameter includes:
selecting the at least one parameter to control an output wavelength of the tunable laser; and
controlling input to the one or more tuning elements for modulating the current supplied to the VTDBR in order to change an optical frequency of the VTDBR above and/or below an equal optical frequency interval per unit time such that a linewidth of the tunable laser increases and a point spread function measured through the fiber optic component changes.

20. The laser system of claim 10, wherein the tunable laser is a swept-wavelength laser.

\* \* \* \* \*